(12) United States Patent
Brcka

(10) Patent No.: US 8,715,455 B2
(45) Date of Patent: May 6, 2014

(54) MULTI-ZONE GAS DISTRIBUTION SYSTEM FOR A TREATMENT SYSTEM

(75) Inventor: Jozef Brcka, Loundonville, NY (US)

(73) Assignee: Tokyo Electron Limited, Tokyo (JP)

( * ) Notice: Subject to any disclaimer, the term of this patent is extended or adjusted under 35 U.S.C. 154(b) by 908 days.

(21) Appl. No.: 11/671,704

(22) Filed: Feb. 6, 2007

(65) Prior Publication Data

US 2008/0185104 A1 Aug. 7, 2008

(51) Int. Cl.
*H01L 21/306* (2006.01)
*H01L 21/3065* (2006.01)

(52) U.S. Cl.
USPC ............ 156/345.34; 156/345.39; 156/345.33; 118/715; 422/187

(58) Field of Classification Search
CPC .................. C23C 16/45565; C23C 16/45561; C23C 16/45576; C23C 16/45574; C23C 16/505; C23C 16/511; C23C 16/0227; C23C 16/0236; C23C 16/0245; C23C 16/45563; C23C 16/45578; C23C 16/45587; C23C 16/45595; H01J 37/32633
USPC ........... 118/715; 156/345.33, 345.34, 345.29; 422/187

See application file for complete search history.

(56) References Cited

U.S. PATENT DOCUMENTS

| | | | |
|---|---|---|---|
| 5,532,190 A * | 7/1996 | Goodyear et al. | 438/710 |
| 5,792,272 A | 8/1998 | Van Os et al. | |
| 5,983,906 A * | 11/1999 | Zhao et al. | 134/1.1 |
| 6,059,885 A * | 5/2000 | Ohashi et al. | 118/730 |
| 6,090,210 A * | 7/2000 | Ballance et al. | 118/725 |
| 6,475,854 B2 | 11/2002 | Narwankar et al. | |
| 6,852,167 B2 * | 2/2005 | Ahn | 118/715 |
| 7,138,067 B2 | 11/2006 | Vahedi et al. | |
| 2002/0088542 A1 * | 7/2002 | Nishikawa et al. | 156/345.29 |
| 2004/0129212 A1 * | 7/2004 | Gadgil et al. | 118/715 |
| 2004/0129217 A1 * | 7/2004 | Strang | 118/715 |
| 2005/0221000 A1 * | 10/2005 | Ikeda et al. | 427/248.1 |
| 2005/0269292 A1 * | 12/2005 | Koshiishi et al. | 216/67 |

FOREIGN PATENT DOCUMENTS

JP        63-053932        * 3/1988

* cited by examiner

*Primary Examiner* — Jeffrie R Lund
*Assistant Examiner* — Satish Chandra
(74) *Attorney, Agent, or Firm* — Oblon, Spivak, McClelland, Maier & Neustadt, L.L.P.

(57) ABSTRACT

A treatment system is described for exposing a substrate to various processes. Additionally, a gas distribution system is configured to be coupled to and utilized with the treatment system in order to distribute process material above the substrate is provided. The treatment system includes a process chamber, a radical generation system coupled to the process chamber, a gas distribution system coupled to the radical generation system and configured to distribute reactive radicals above a substrate, and a temperature controlled pedestal coupled to the vacuum chamber and configured to support the substrate. The gas distribution system is configured to efficiently transport radicals to the substrate and distribute the radicals above the substrate.

25 Claims, 11 Drawing Sheets

MULTI-ZONE GAS DISTRIBUTION SYSTEM FOR A TREATMENT SYSTEM

CROSS REFERENCE TO RELATED APPLICATIONS

The present invention is related to pending U.S. patent application Ser. No. 11/390,196, entitled "GAS DISTRIBUTION SYSTEM FOR A POST-ETCH TREATMENT SYSTEM," filed on Mar. 28, 2006. The entire contents of this application are herein incorporated by reference.

BACKGROUND OF THE INVENTION

1. Field of the Invention

The present invention relates to a treatment system for treatment of a substrate, and more particularly to a treatment system having a gas distribution system configured to efficiently transport a treating agent to the substrate and distribute the treating agent above the substrate.

2. Description of Related Art

Typically, plasma treatment, including remote plasma treatment, is utilized in semiconductor device manufacturing during material processing, surface preparation, and cleaning of substrates and the respective thin films thereon. Amongst other things, these treatments enable integration of processes during device fabrication, enhance the performance of device metallization, and optimize the yield of working devices. For example, a hydrogen ($H_2$) plasma, or plasma formed of a mixture of hydrogen and other gaseous additives, may be used to clean contact surfaces in electronic structures prior to metallization of these electronic structures. In yet another example, an oxygen ($O_2$) plasma, or plasma formed of a mixture of oxygen and other gaseous additives, may be used to remove mask residue and etch residue remaining on the substrate following an etching application. The use of such plasma treatments is common throughout front-end-of-line (FEOL) applications during transistor fabrication as well as back-end-of-line (BEOL) applications.

However, in many applications where plasma treatment is utilized, the devices being fabricated are sensitive to the energetic species of the plasma and may suffer damage when exposed to such species. For example, the immersion of the substrate within plasma can lead to uncontrolled exposure to high energy charged particles (e.g., energetic electrons, etc.) and electro-magnetic (EM) radiation (e.g., ultraviolet (UV) radiation), which may cause damage to underlying layers and/or structures that is unacceptable to the device manufacturers. Therefore, many of these applications require plasma treatment, wherein plasma is formed remotely. The remote plasma facilitates the formation of reactive species that are transported to the substrate to catalyze the treatment process.

SUMMARY OF THE INVENTION

The present invention relates to a system for treating a substrate, and to a system for treating a substrate with a treating agent. For example, the treating agent may comprise an atomic or molecular radical.

According to one embodiment, a treatment system is described for removing residue or contamination on a substrate using a flow of atomic or molecular radicals.

According to another embodiment, a treatment system includes a process chamber, including a process space; a radical generation system coupled to the process chamber and configured to receive process gas and produce radicals from the process gas; a gas distribution system configured to receive and distribute a flow of the radicals within the process space, wherein the gas distribution system comprises an inlet coupled to an exit of the radical generation system, an outlet coupled to the process chamber, and a dividing member coupled to the gas distribution system and configured to separately divert a portion of the flow of the process gas through the inlet to a first region above the substrate, and separately divert the remaining portion of the flow of the process gas through the inlet to a second region above the substrate; a pedestal coupled to the process chamber and configured to support a substrate in the process space of the process chamber and adjust the temperature of the substrate; and a vacuum pumping system coupled to the process chamber and configured to evacuate the process chamber.

According to yet another embodiment, a gas distribution system is described including: a main body having an inlet configured to receive a flow of process gas, an outlet configured to distribute the process gas in the processing system, and a dividing member coupled to the gas distribution system and configured to separately divert a portion of the flow of the process gas through the inlet to a first region above the substrate, and separately divert the remaining portion of the flow of the process gas through the inlet to a second region above the substrate.

DETAILED DESCRIPTION OF PREFERRED EMBODIMENTS

In the following description, in order to facilitate a thorough understanding of the invention and for purposes of explanation and not limitation, specific details are set forth, such as a particular geometry of the treatment system and descriptions of the gas distribution system. However, it should be understood that the invention may be practiced in other embodiments that depart from these specific details.

In material processing methodologies, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure of the light-sensitive material to a geometric pattern of electro-magnetic (EM) radiation using, for example, a micro-lithography system, followed by the removal of the irradiated regions of the light-sensitive material (as in the case of positive photo-resist), or non-irradiated regions (as in the case of negative resist) using a developing solvent.

Figure 1A:
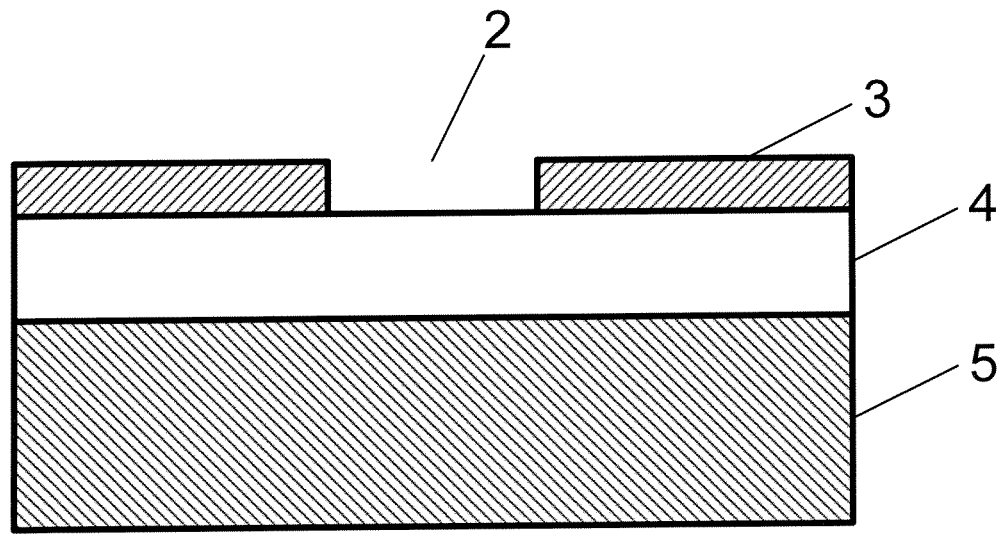
FIGS. 1A, 1B, and 1C show a schematic representation of a procedure for fabricating feature in a thin film on a substrate.
Figure 1B:
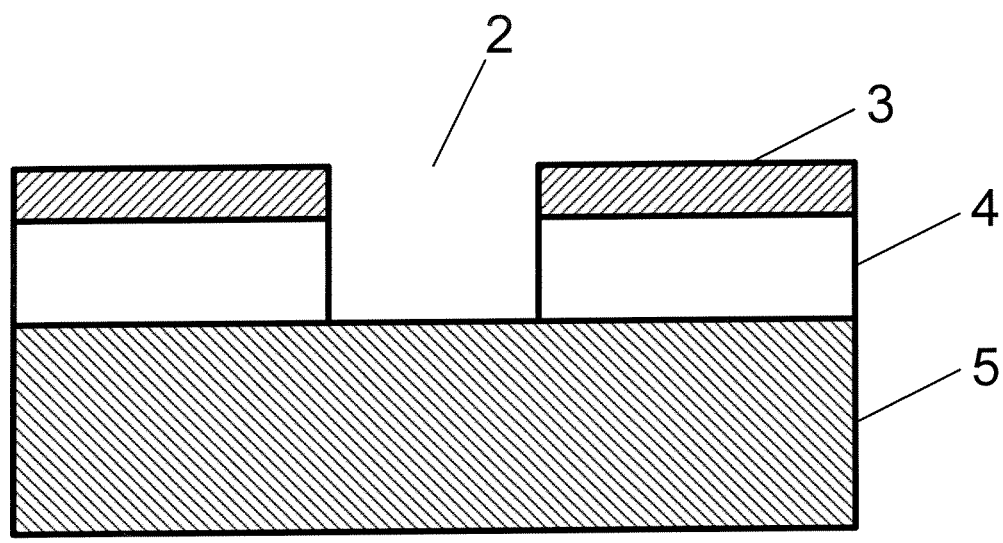
Figure 1C:
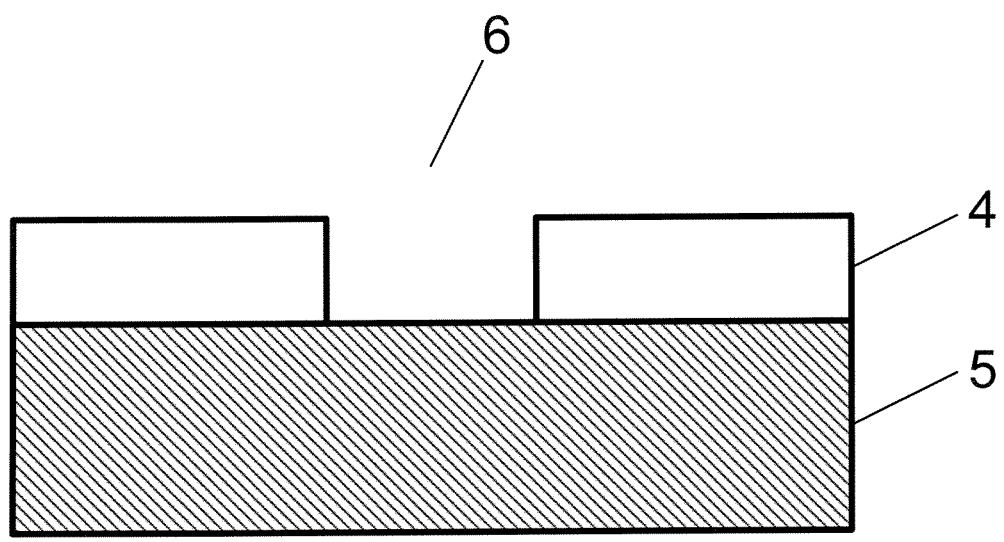

For example, as shown in FIGS. 1A through 1C, a mask comprising light-sensitive layer 3 with pattern 2 (such as patterned photoresist) can be utilized for transferring feature patterns into a thin film 4 on a substrate 5. The pattern 2 is transferred to the thin film 4 using, for instance, dry plasma etching, in order to form feature 6, and upon completion of etching, the mask 3 is removed. Conventionally, the mask 3, as well as other residues that accumulate on the sidewalls and/or the bottom of feature pattern 2 formed in the thin film 4, are removed.

For example, organic residue, such as photoresist, or halogen residue from polysilicon etching, are removed by immersing the substrate in plasma, such as an oxygen plasma, and the remaining mask and post-etch residue are ashed (or stripped). Additionally, for example, other contaminants including native metal oxides formed on the bottom of feature pattern 2 where contact is to be made with, for instance, a metal line, are removed by immersing the substrate in plasma, such as a hydrogen plasma, to remove and the native oxide. However, when dry cleaning substrates having sensitive or delicate structures or layers, such as during contact formation in front-end-of-line (FEOL) applications in semiconductor manufacturing, direct exposure to plasma can have detrimental effects on the device due to the presence of energetic (charged) particles, electro-magnetic (EM) radiation, etc.

Figure 2:
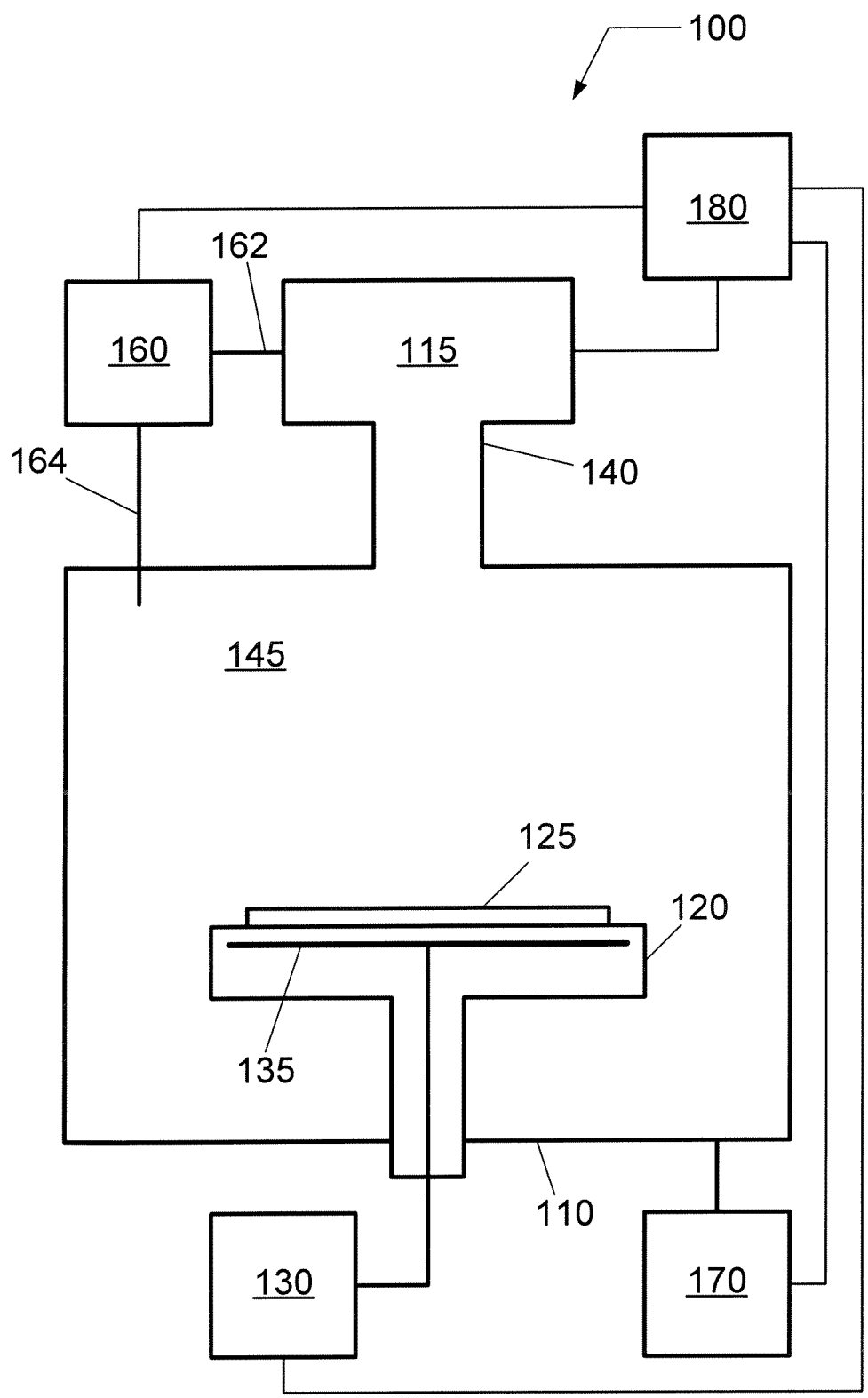
FIG. 2 shows a schematic diagram of a treatment system.

Referring now to FIG. 2, a treatment system 100 is depicted comprising a process chamber 110 having a pedestal 120 configured to support a substrate 125, upon which a treatment process, such as a residue removal process or oxide removal process, is performed using a treating agent. Substrate 125 can be, for example, a semiconductor substrate, a wafer or a liquid crystal display. Additionally, a radical generation system 115 is coupled to the process chamber 110 via a radical delivery system 140 in order to introduce the treating agent to substrate 125.

The process chamber 110 is further coupled to a vacuum pumping system 170 through a duct and a pressure control system (e.g., vacuum valve, etc.), wherein the pumping system 170 is configured to evacuate the process chamber 110, the radical delivery system 140, and the radical generation system 115 to a pressure suitable for performing the treatment process on substrate 125, and suitable for production of radicals in the radical generation system 115.

Referring still to FIG. 2, the radical generation system 115 is configured to remotely generate atomic radicals or molecular radicals or both from a process gas supplied from a gas supply system 160 through one or more gas supply conduits 162. The radicals formed remotely in radical generation system 115 are transported through radical delivery system 140 and introduced to process space 145 above substrate 125. The radical delivery system 140 introduces the radicals to process space 145 while providing minimal impedance to the flow of radicals and inhibiting the recombination of radicals prior to reaching the substrate surface. For example, the radical delivery system may include a duct having a duct inlet coupled to an outlet of the radical generation system 115, and a duct outlet coupled to the process chamber 110.

The radical generation system 115 is configured to produce one or more chemical radicals configured to chemically treat substrate 125 and, for example, react with and remove any residue, contaminant, etc. with minimal damage to substrate 125. For example, the radical generation system 115 can include an upstream plasma source configured to generate oxygen, hydrogen or fluorine radical from a process gas comprising an oxygen containing gas, a hydrogen containing gas, or a fluorine containing gas, or any combination of two or more thereof. For instance, the process gas can include oxygen ($O_2$), hydrogen ($H_2$), CO, $CO_2$, NO, $NO_2$, $N_2O$ (or, more generally, $N_xO_y$), $N_2$, nitrogen trifluoride ($NF_3$), $NH_3$, $O_3$, $XeF_2$, $ClF_3$, a hydrocarbon (or, more generally, $C_xH_y$), a hydrofluorocarbon (or, more generally, $C_xH_yF_z$), or a fluorocarbon (or, more generally, $C_xF_y$), or any combination of two or more thereof, respectively. The radical generation system 115 can include an Astron® reactive gas generator, commercially available from MKS Instruments, Inc., ASTeX® Products (90 Industrial Way, Wilmington, Mass. 01887). Alternatively, the radical generation system 115 can comprise an inductive coil or pair of electrodes disposed about the radical delivery system 140.

In addition to supplying process gas to radical generation system 115, gas supply system 160 can be further configured to supply an auxiliary process gas to radical generation system 115 through the one or more gas supply conduits 162. The auxiliary process gas can be utilized as a carrier gas to assist the transport of radicals formed in the radical generation system 115 to process space 145, or the auxiliary process gas can be utilized to dilute the process gas and radicals formed from the process gas. The auxiliary gas may include an inert gas, such as a noble gas (i.e., He, Ne, Ar, Kr, Xe), or nitrogen ($N_2$), or a combination thereof. Furthermore, the gas supply system 160 can be configured to introduce the auxiliary process gas directly to process chamber 110 through one or more auxiliary gas supply conduits 164.

Although not shown, the gas supply system 160 can comprise one or more gas sources, one or more control valves, one or more filters, and/or one or more mass flow controllers. For instance, the flow rate of process gas or auxiliary process gas can range from approximately 1 sccm (standard cubic centimeters per minute) to approximately 10000 sccm (or 10 standard liters per minute, slm). For example, the flow rate of process gas or auxiliary process gas can range from about 1 slm to about 5 slm. By way of further example, the flow rate of process gas or auxiliary process gas can range from about 3 slm to about 5 slm.

Downstream from the radical generation system 115, radicals flow through the radical delivery system 140 and into process space 145 within process chamber 110. The radical delivery system 140 can be coupled to a vapor line temperature control system (not shown) in order to control temperature of the radical delivery system. For example, the temperature can be set to a value ranging from approximately 20 degrees C. to approximately 100 degrees C., and by way of another example, the temperature can be set to a value ranging from about 40 degrees C. to about 80 degrees C. Additionally, for example, the radical delivery system 140 can be characterized by a high conductance in excess of about 50 liters/second.

Once radical flow enters the process space 145, the radicals chemically react with residues on the surfaces of substrate 125. The pedestal 120 is configured to elevate the temperature of substrate 125 by virtue of a heating element 135 embedded within pedestal 120 being coupled to a temperature control system 130. Heating element 135 may be a resistive heating element, or heating element 135 may comprise an array of thermo-electric devices. Additional details for the use of thermoelectric devices in a substrate holder are provided in pending U.S. Pat. No. 7,141,763, entitled "METHOD AND APPARATUS FOR RAPID TEMPERATURE CHANGE AND CONTROL", the entire contents of which are herein incorporated by reference. For example, the temperature control system 130 can be configured to elevate the temperature of substrate 125 up to approximately 500° C. In one embodiment, the substrate temperature can range from about 40° C. to about 500° C. In another embodiment, the substrate temperature can range from about 100° C. to about 300° C. Additionally, process chamber 110 can be coupled to temperature control system 130 configured to control the temperature of the chamber walls.

In addition to elevating the temperature of substrate 125, pedestal 120 is configured to support substrate 125 during treatment. The pedestal 120 can further comprise a lift pin assembly (not shown) capable of raising and lowering three or more lift pins in order to vertically transfer substrate 125 to and from an upper surface of the pedestal 120 and a transfer plane in the process chamber 110.

In the lift pin assembly, the substrate lift pins can be coupled to a common lift pin element, and can be lowered to below the upper surface of pedestal 120. A drive mechanism (not shown) utilizing, for example, an electric drive system (having an electric stepper motor and threaded rod) or a pneumatic drive system (having an air cylinder), provides means for raising and lowering the common lift pin element. Substrate 125 can be transferred into and out of process chamber 110 through a gate valve (not shown) and chamber feed-through passage, aligned on the transfer plane, via a robotic transfer system (not shown), and received by the substrate lift pins. Once the substrate 125 is received from the transfer system, it can be lowered to the upper surface of the pedestal 120 by lowering the substrate lift pins.

Pedestal 120 may provide a clamping system to clamp substrate 125 to pedestal 120, or it may not provide a clamping system. Additionally, pedestal 120 may provide a backside gas supply system configured to supply a heat transfer gas to the backside of substrate 125 in order to improve the thermal conduction between substrate 125 and pedestal 120, or it may not provide a backside gas supply system.

As illustrated in FIG. 2, an exhaust line (shown schematically as 165) connects process chamber 110 to vacuum pumping system 170. Vacuum pumping system 170 comprises a vacuum pump to evacuate process chamber 110 to the desired degree of vacuum, and to remove gaseous species from the process chamber 110 during processing. An automatic pressure controller (APC) and an optional trap can be used in series with the vacuum pump. The vacuum pump can include a dry roughing pump. Alternatively, the vacuum pump can include a turbo-molecular pump (TMP) capable of a pumping speed up to 5000 liters per second (and greater). During processing, the process gas, or auxiliary process gas, or any combination thereof, can be introduced into the process chamber 110, and the chamber pressure can be adjusted by the APC. For example, the chamber pressure can range from approximately 1 mtorr to approximately 50 Torr, and in a further example, the chamber pressure can range from about 1 Torr to about 10 Torr. The APC can comprise a butterfly-type valve, or a gate valve. The trap can collect by-products from the process chamber 110.

Additionally, any element within treatment system 100 can be coated with a ceramic material, such as aluminum oxide or yttrium oxide. For example, any element may be coated with a material selected from the group consisting of $Al_2O_3$, $Sc_2O_3$, $Sc_2F_3$, $YF_3$, $La_2O_3$, $Y_2O_3$, and $DyO_3$.

Still referring the FIG. 2, the treatment system 100 can further include a control system 180 configured to operate, and control the operation of the treatment system 100. The control system 180 is coupled to the process chamber 110, the pedestal 120, the temperature control system 130, the radical generation system 115, the gas supply system 160, and the vacuum pumping system 170.

The control system 180 can include a microprocessor, a memory, and a digital I/O port capable of generating control voltages sufficient to communicate and activate inputs of the treatment system 100 as well as monitor outputs from the treatment system 100. Moreover, the control system 180 is coupled to and exchanges information with process chamber 110, the pedestal 120, the temperature control system 130, the radical generation system 115, the gas supply system 160, and the vacuum pumping system 170. A program stored in the memory is utilized to control the aforementioned components of treatment system 100 according to a stored process recipe. One example of processing system control system 180 is a DELL PRECISION WORKSTATION 610™, available from Dell Corporation, Dallas, Tex. The control system 180 may also be implemented as a general-purpose computer, digital signal processor, etc.

The control system 180 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 180 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the control system 180, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the control system 180 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to a processor of controller for execution. For example, the instructions may initially be carried on a magnetic disk of a remote computer. The remote computer can load the instructions for implementing all or a portion of the present invention remotely into a dynamic memory and send the instructions over a network to the controller 180.

Control system 180 may be locally located relative to the treatment system 100, or it may be remotely located relative to the treatment system 100 via an internet or intranet. Thus, control system 180 can exchange data with the treatment system 100 using at least one of a direct connection, an intranet, or the internet. Control system 180 may be coupled to an intranet at a customer site (i.e., a device maker, etc.), or coupled to an intranet at a vendor site (i.e., an equipment manufacturer). Furthermore, another computer (i.e., controller, server, etc.) can access control system 180 to exchange data via at least one of a direct connection, an intranet, or the internet.

As noted above, the treatment system 100 of FIG. 2 provides remote generation of radicals and delivery of such radicals to the substrate within the process chamber. Such a configuration can allow treatment such as dry cleaning of contaminants on the substrate while minimizing damage to the substrate that can be caused by high energy charged particles in close proximity to the substrate. However, use of the remote radical generator can reduce the treatment rate of the substrate and/or cause non-uniform treatment of the substrate. The present inventor has discovered that design features such as geometry of the radical delivery system can affect the uniform distribution of radicals, as well as the recombination of rate of radicals which affects treatment rate at the substrate. Generally, unimpeded flow of the radicals to the substrate surface reduces recombination to improve treatment rate, but provides poor uniformity of treatment. Conversely, providing impediments to the gas flow (such as a distribution plate) can improve uniformity, but reduce treatment rate. Thus, embodiments of the present invention include different radical delivery systems that control uniform substrate treatment, and/or substrate treatment rate.

Figure 3:
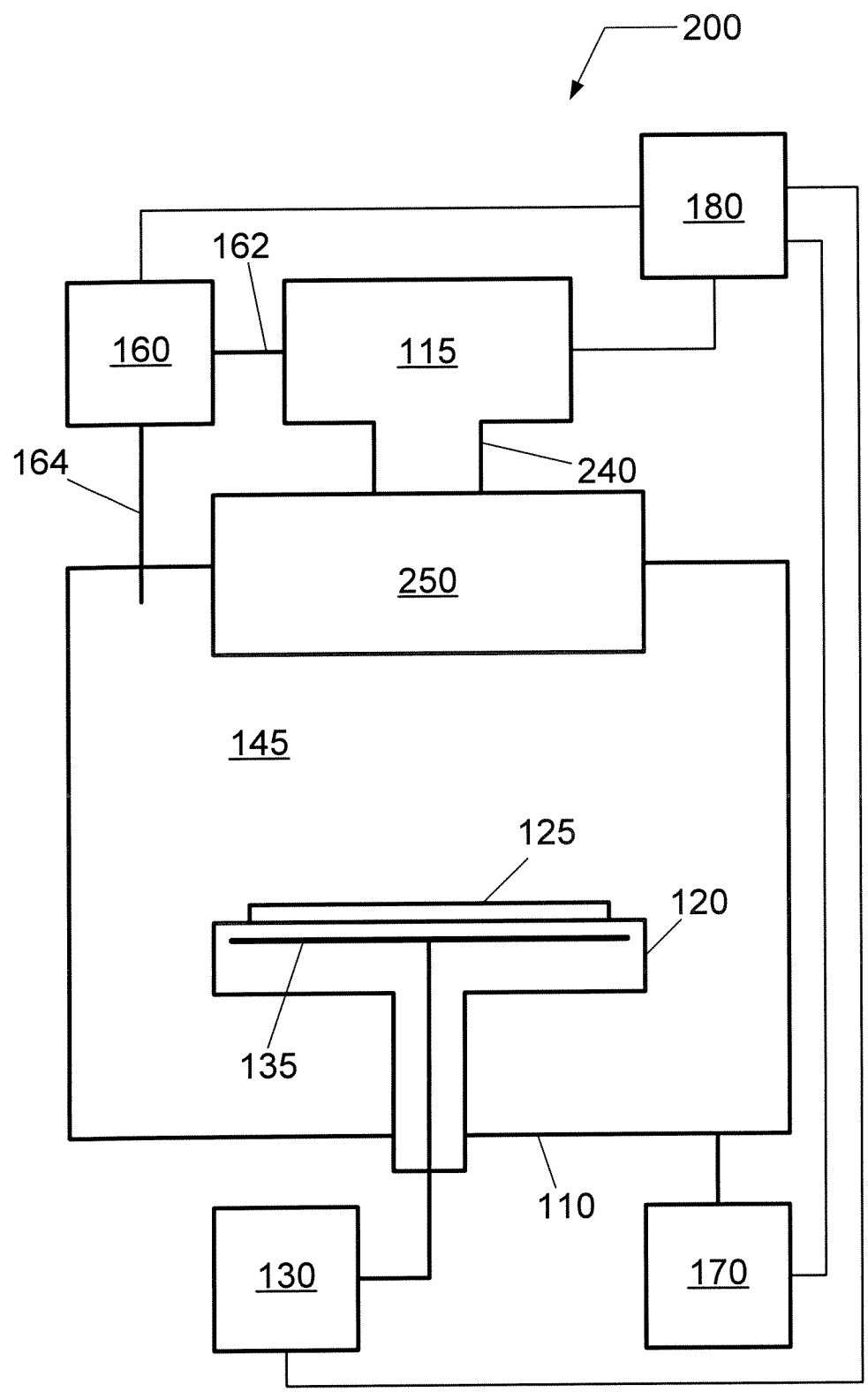
FIG. 3 shows a schematic diagram of a treatment system according to an embodiment.

Referring now to FIG. 3, a treatment system 200 is depicted according to another embodiment. The treatment system 200 can, for example, be similar to the embodiment of FIG. 2, wherein like reference numerals designate same or similar components. Treatment system 200 comprises a gas distribution system 250 coupled to the outlet of the radical generation system 115 through duct 240. The gas distribution system 250 distributes radicals received from duct 240 within a process space 145 above substrate 125.

Figure 4A:
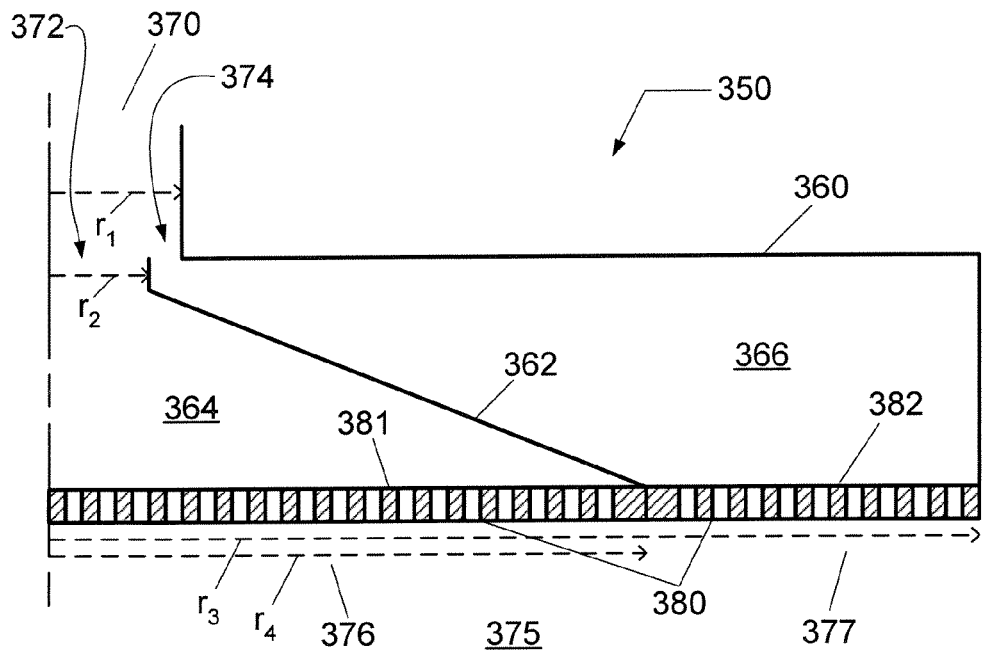
FIGS. 4A and 4B show a schematic diagram of a gas distribution system according to another embodiment.

According to an embodiment, FIG. 4A illustrates a schematic view of a gas distribution system 350. The gas distribution system 350 comprises a main body 360 having an inlet 370 coupled to a radical generation system, and configured to receive a flow of a treating agent from the radical generation system and distribute the flow of the treating agent through a gas distribution plate 380 above a substrate in process space 375.

The main body 360 comprises an inner plenum 364 and an outer plenum 366, separated from the inner plenum by dividing member 362. In this embodiment, the dividing member 362 diverts an inner portion of the flow of treating agent to a central region above the substrate, while the dividing member 362 diverts an outer portion of the flow of treating agent to a peripheral region above the substrate. In doing so, relatively higher velocity fluid can be distributed to the central region above the substrate, while relatively slower velocity fluid can be distributed to the peripheral region above the substrate. The inner plenum 364 is configured to receive a portion of the flow of treating agent entering inlet 370 through a center inlet 372. Furthermore, the inner plenum 364 is configured to introduce this portion of the total flow to a substantially central region 376 of process space 375 through an inner plate member 381 of gas distribution plate 380. The outer plenum 366 is configured to receive a remaining portion of the flow of treating agent entering inlet 370 through an annular inlet 374. Furthermore, the outer plenum 366 is configured to introduce this portion of the total flow to a substantially peripheral region 377 of process space 375 through an outer plate member 382 of gas distribution plate 380.

The inner plate member 381 and the outer plate member 382 of gas distribution plate 380 are each designed with a plurality of openings ranging in number from approximately 1 opening to approximately 1000 openings, and desirably ranging in number from approximately 10 openings to approximately 100 openings. Additionally, for example, the inner plate member 381 and the outer plate member 382 can be designed with a plurality of openings, each opening having a diameter ranging from approximately 1 mm to approximately 100 mm, and desirably ranging from approximately 4 mm to approximately 10 mm. Furthermore, for example, the inner plate member 381 and the outer plate member 382 can be designed with a plurality of openings, each opening having a length ranging from approximately 1 mm to approximately 100 mm, and desirably ranging from approximately 2 mm to approximately 20 mm. Further, the inner plate member 381 and/or outer plate member 382 may include gaps or slots as described below with respect to FIGS. 8A-8F.

Figure 4B:
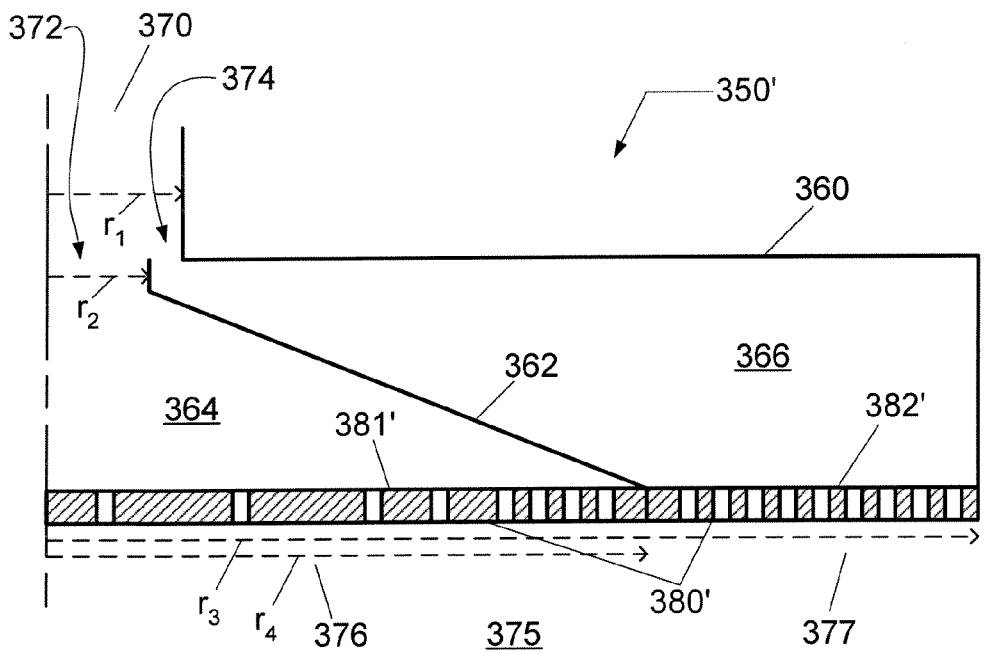

In one embodiment, the one or more openings are distributed uniformly on the inner plate member 381 and the outer plate member 382 of gas distribution system 380, as shown in FIG. 4A. Alternatively, in another embodiment, the one or more openings are not distributed uniformly on inner plate member 381' and outer plate member 382' of gas distribution system 380', as shown in FIG. 4B. Alternatively, in yet another embodiment, the distribution of the one or more openings is not uniform within the inner plate member 381, or the distribution of the one or more openings is not uniform within the outer plate member 382, or a combination thereof. For example, there may be more openings within a peripheral region of the inner plate member 381 than within a central region of the inner plate member 381.

The gas distribution plate 380, 380' may be fabricated from a metal, such as aluminum or anodized aluminum, or a ceramic. For example, the gas distribution plate 380, 380' may be fabricated from quartz, silicon, silicon nitride, silicon carbide, carbon, alumina, aluminum nitride, etc. Additionally, the gas distribution plate 380, 380' can be coated with a ceramic material, such as aluminum oxide or yttrium oxide. For example, the gas distribution plate 380, 380' may be coated with a material selected from the group consisting of $Al_2O_3$, $Sc_2O_3$, $Sc_2F_3$, $YF_3$, $La_2O_3$, $Y_2O_3$, and $DyO_3$.

Alternatively, the gas distribution plate 380, 380' is not utilized, and the dividing member 362 directly diverts a portion of the total flow of treating agent to the substantially central region 376 of the substrate and directly diverts the remaining portion of the treating agent to the substantially peripheral region 377 of the substrate.

Referring still to FIGS. 4A and 4B, the inlet 370 to the gas distribution system 350 can be characterized by a first dimension such as radius $r_1$. Additionally, the portion of the total flow entering the inner plenum 364 through central inlet 372 can be dictated by a second dimension such as dividing member radius $r_2$. The remainder of the total flow enters the outer plenum 366 through the annular inlet 374 outside dividing member 362 between radii $r_1$ and $r_2$.

The inventor identifies two potential factors that can affect the active species distribution within the inlet 370 of gas distribution system 350 downstream from the exit of the radical generation system. Firstly, the velocity profile within inlet 370 is assumed to have a parabolic profile, that is:

$$v(r) = v_0(1 - r^2/r_1^2),$$

wherein $v_0$ represents the centerline velocity, and r represents the radius. Secondly, the active species radial profile n(r) will be non-uniform due to diffusion transport and losses (such as recombination) at the walls.

Assuming the pressure $p_0$ to be constant at the inlet 370 of the gas distribution system 350 and a parabolic velocity profile (as provided above), the respective amounts of the total flow entering the inner plenum and the outer plenum may be derived as follows:

$$Q_{inner} = 0.5 p_0 v_0 \eta^2, \text{ and}$$

$$Q_{outer} = 0.5 p_0 v_0 (1 - \eta^2),$$

wherein $\eta$ represents the ratio $r_2/r_1$. After normalizing each quantity $Q_{inner}$ and $Q_{outer}$ by the total flow rate $Q_{total} = 0.5 p_0 v_0$, the separation of the inner and outer flows may be rewritten as $Q_{inner} = \eta^2 (\times 100\%)$ and $Q_{outer} = (1 - \eta^2) (\times 100\%)$. In order to account for the radial profile n(r) of the radical density, as a first approximation, the inventor assumes an average radical concentration at the inlet to the inner and outer plenums. For example, $n_{inner}$ and $n_{outer}$ represent the average radical concentrations for the inlet to the inner plenum and the inlet of the outer plenum, respectively. The expressions for the inner and outer flows are amended to include these quantities.

$$Q_{inner} \cong 0.5 p_0 v_0 \eta^2 \frac{\bar{n}_{inner} \eta^2}{(\bar{n}_{inner} - \bar{n}_{outer})\eta^2 + \bar{n}_{outer}}, \text{ and}$$

$$Q_{outer} \cong 0.5 p_0 v_0 (1 - \eta^2) \frac{\bar{n}_{outer}(1 - \eta^2)}{(\bar{n}_{inner} - \bar{n}_{outer})\eta^2 + \bar{n}_{outer}}.$$

Figure 4C:
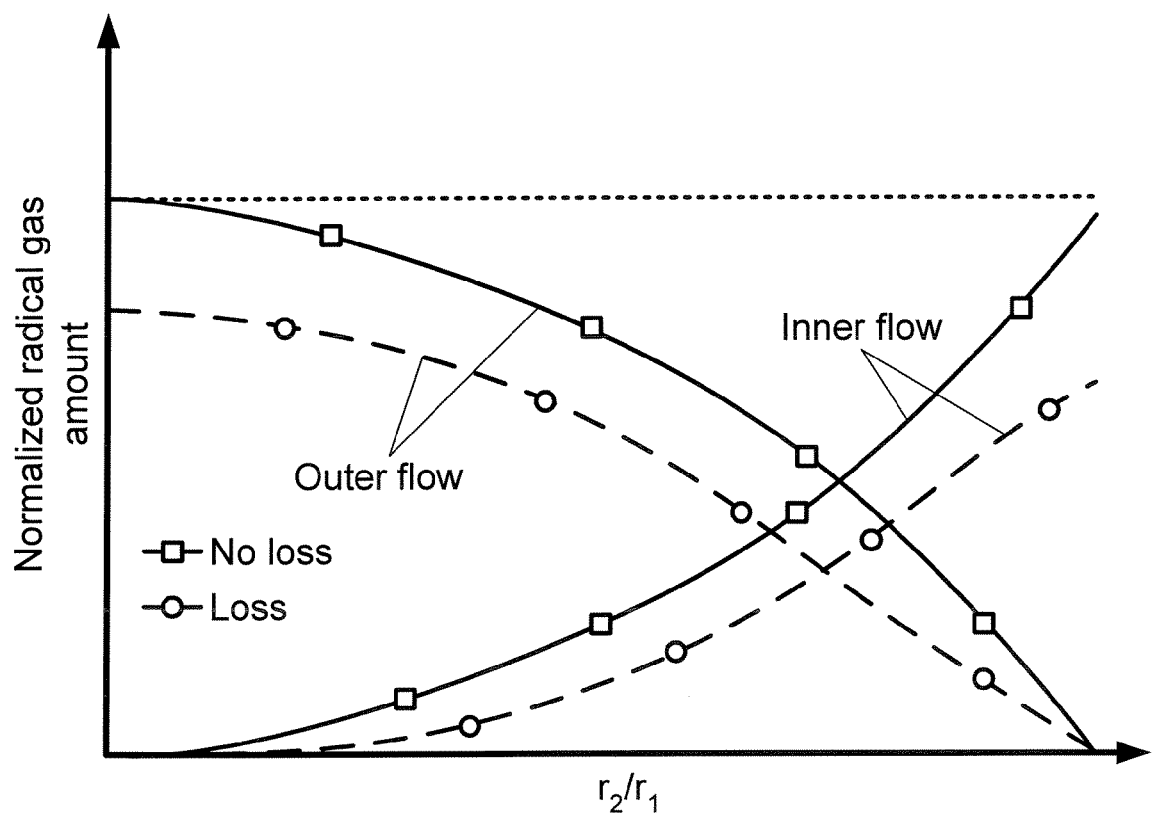
FIG. 4C illustrates a relationship between inner and outer gas flows for the gas distribution systems depicted in FIGS. 4A and 4B.

FIG. 4C illustrates the dependence of the inner and outer flows on $\eta$ (the position of dividing member 362) for a flow when no wall loss is considered (denoted by open squares) and a flow when wall loss is considered (denoted by open circles). As seen in this figure, the position of the dividing member can be set such that the outer flow and inner flow are substantially equal (denoted by intersection of inner and outer flow curves). Alternatively, the dividing member can be positioned such that the inner and outer flows are non-equal. This may be useful, for example, to provide non-uniform distribution of radicals across the substrate surface to compensate for other process non-uniformities.

In addition to the position $\eta$ of the dividing member 362 at the inlet 370, the position $\eta_2 = r_4/r_3$ of the dividing member at the gas distribution plate 380, 380', as well as the distribution of openings in the inner plate member 381 and the outer plate member 382 are also utilized to adjust and/or control the uniformity of the spatial distribution of radicals at the surface of the substrate. These parameters may be determined using either experiment or simulation.

For example, computational simulation of a geometry characteristic of FIGS. 4A and 4B has been performed for a flow of hydrogen radicals while accommodating for recombination losses. The simulation software can, for example, include a 2D/3D plasma fluid model, that can be developed, for example, by utilization of a commercial software package such as COMSOL Multi-physics™ commercially available from Comsol, Inc. (1 New England Executive Park, Suite 350, Burlington, Mass., 01803).

Figure 5:
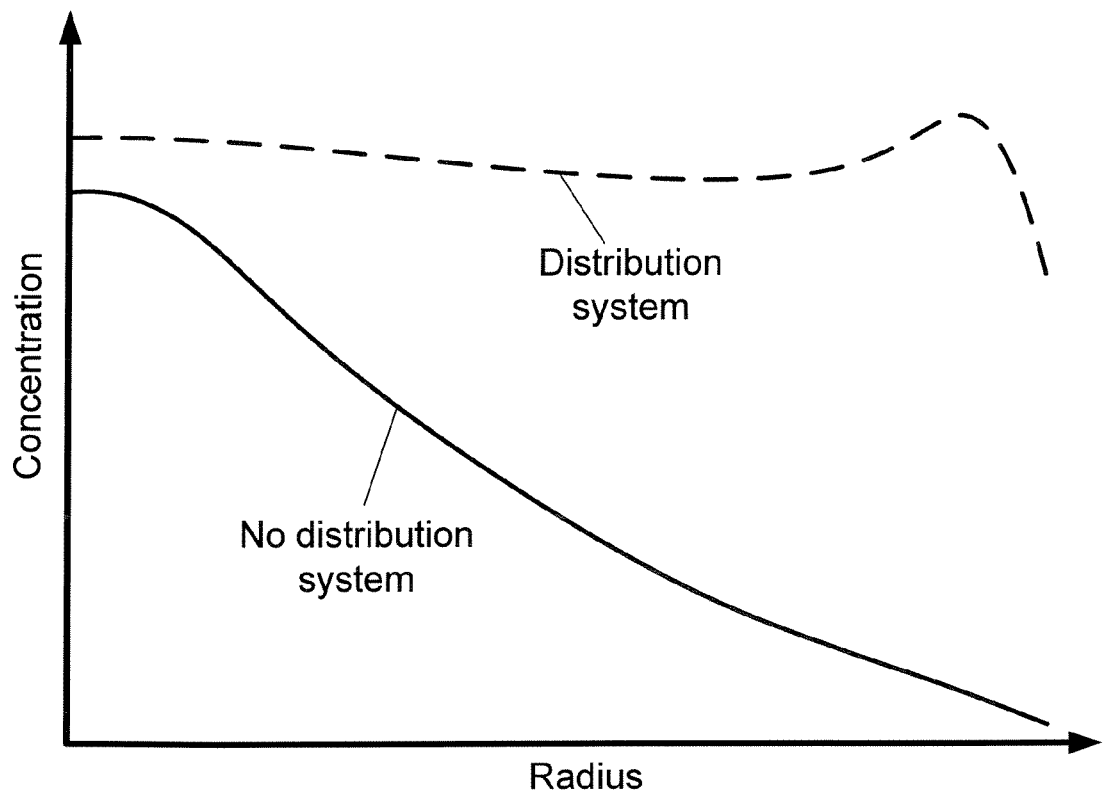
FIG. 5 illustrates a relationship between the spatial distribution of the treating agent concentration at the substrate and the gas distribution system utilized to distribute the treating agent.

Referring now to FIG. 5, exemplary results of the simulation are illustrated for a 300 mm diameter (DIA) substrate and a radical supply inlet (e.g., inlet 370) of 63.5 mm DIA. Results for the spatial distribution of hydrogen radical concentration versus radius at the substrate are presented for a no gas distribution system (solid line) and for a gas distribution system characteristic of FIGS. 4A and 4B (dashed line). The simulation results of FIG. 5 were provided for a gas distribution system having a value $r_1$ equal to 16 cm and a value $r_2$ equal to around 2.5 cm, for a value $\eta \sim 0.16$ according to the equations provided above. At these conditions the parameter $r_3$ corresponds to the 300 mm wafer size, and parameter $r_4$ approximately 120-130 mm ($r_4/r_3 \sim 0.8$-$0.87$). The distance between the wafer and plate was set to 10 mm, the working pressure was set to 60 Pa (450 mtorr), and the gas used was hydrogen at flow rate of 200 sccm at the inlet into plasma/radical source.

FIG. 5 suggests a dramatic improvement in the uniformity of radical concentration at the substrate when using a gas distribution system as provided above. For example, the non-uniformity has been found to be less than 10% when a gas distribution system of the present invention is utilized. Furthermore, the improvement to uniformity is not accompanied by a decrease in the absolute radical concentration at the substrate. In other words, the gas distribution system facilitates a substantially uniform distribution of the radical concentration while not impeding the flow of radicals in such a way to cause excessive losses or recombination. The results in FIG. 5 are for the specific embodiment of the invention described above. However, the present invention is not limited to this specific embodiment, and similar advantages of the present invention are expected for other embodiments.

For example, optimal $r_2$ in respect to $r_1$ (or parameter $\eta$) depends on several variables including active species (radicals) distribution on the inlet into distribution system, surface material (loss) and conductance through inner and outer sections, and ratio $r_3/r_4$ at the outlet from the distribution system. One or more of these variables can be changed to achieve a desired result in accordance with principles of the invention. For example, the $r_1$ value is selected to fit the outlet of a particular commercial plasma/radical source, which can vary. Thus, the value $r_1$ can range from 3 cm to 30 cm. Similarly, in dependence on the actual plasma/radical source, the value of $r_2$ can be in the range $0.1 \times r_1 < r_2 < 0.9 \times r_1$ (that is about $0.1 < \eta < 0.9$). Where it is undesirable to restrict gas flow too much, the value may more strictly be about $0.3 < \eta < 0.7$. The ratio $r_4/r_3$ can be approximately 0.7 (this ratio splits wafer into two portions having approximately the same area 50%-50%). A $r_4/r_3$ value of approximately 0.87 will provide a wafer surface split by area at about 75% central portion and 25% outer portions. As would be understood by one of ordinary skill in the art, different values may also be determined based on the teachings provided herein.

Figure 6:
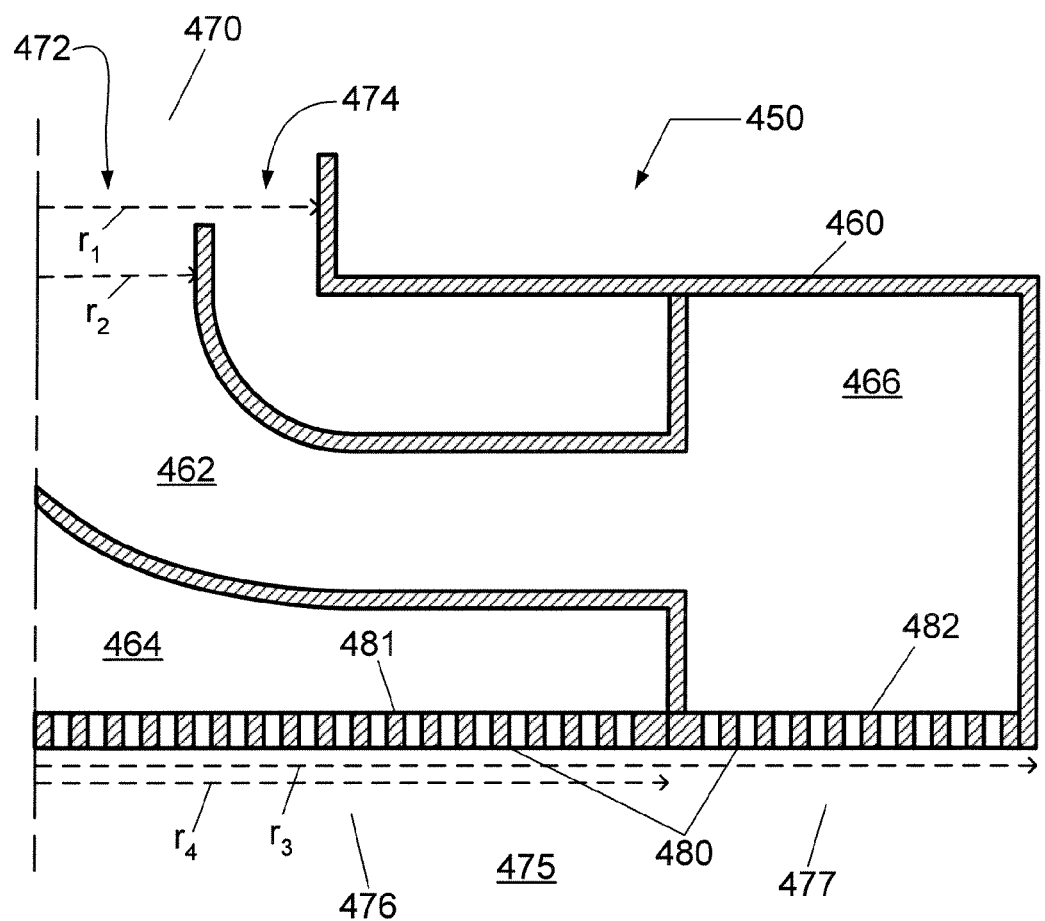
FIG. 6 shows a schematic diagram of a gas distribution system according to another embodiment.

According to another embodiment, FIG. 6 illustrates a schematic view of a gas distribution system 450. The gas distribution system 450 comprises a main body 460 having an inlet 470 coupled to a radical generation system, and configured to receive a flow of a treating agent from the radical generation system and distribute the flow of the treating agent through a gas distribution plate 480 above a substrate in process space 475.

The main body 460 comprises an inner plenum 464 and an outer plenum 466, separated from the inner plenum by dividing member 462. In this embodiment, the dividing member 462 diverts an inner portion of the flow of treating agent to a peripheral region above the substrate, while the dividing member diverts an outer portion of the flow of treating agent to a central region above the substrate. In doing so, relatively higher velocity fluid can be distributed to the peripheral region above the substrate, while relatively slower velocity fluid can be distributed to the central region above the substrate. The inner plenum 464 is configured to receive a portion of the flow of treating agent entering inlet 470 through an annular inlet 474. Furthermore, the inner plenum 464 is configured to introduce this portion of the total flow to a substantially central region 476 of process space 475 through an inner plate member 481 of gas distribution plate 480. The outer plenum 466 is configured to receive a remaining portion of the flow of treating agent entering inlet 470 through a central inlet 472. Furthermore, the outer plenum 466 is configured to introduce this portion of the total flow to a substantially peripheral region 477 of process space 475 through an outer plate member 482 of gas distribution plate 480.

The inner plate member 481 and the outer plate member 482 of gas distribution plate 480 are each designed with a plurality of openings ranging in number from approximately 1 opening to approximately 1000 openings, and desirably ranging in number from approximately 10 openings to approximately 100 openings. Additionally, for example, the inner plate member 481 and the outer plate member 482 can be designed with a plurality of openings, each opening having a diameter ranging from approximately 1 mm to approximately 100 mm, and desirably ranging from approximately 4 mm to approximately 10 mm. Furthermore, for example, the inner plate member 481 and the outer plate member 482 can be designed with a plurality of openings, each opening having a length ranging from approximately 1 mm to approximately 100 mm, and desirably ranging from approximately 2 mm to approximately 20 mm. Further, the inner plate member 481 and/or outer plate member 482 may include gaps or slots as described below with respect to FIGS. 8A-8F.

In one embodiment, the one or more openings are distributed uniformly on the inner plate member 481 and the outer plate member 482 of gas distribution system 480. Alternatively, in another embodiment, the one or more openings are not distributed uniformly on inner plate member 481 and outer plate member 482 of gas distribution system 480. Alternatively, in yet another embodiment, the distribution of the one or more openings is not uniform within the inner plate member 481, or the distribution of the one or more openings is not uniform within the outer plate member 482, or a combination thereof. For example, there may be more openings within a peripheral region of the inner plate member 481 than within a central region of the inner plate member 481.

The gas distribution plate 480 may be fabricated from a metal, such as aluminum or anodized aluminum, or a ceramic. For example, the gas distribution plate 480 may be fabricated from quartz, silicon, silicon nitride, silicon carbide, carbon, alumina, aluminum nitride, etc. Additionally, the gas distribution plate 480 can be coated with a ceramic material, such as aluminum oxide or yttrium oxide. For example, the gas distribution plate 480 may be coated with a material selected from the group consisting of $Al_2O_3$, $Sc_2O_3$, $Sc_2F_3$, $YF_3$, $La_2O_3$, $Y_2O_3$, and $DyO_3$.

Alternatively, the gas distribution plate 480 is not utilized, and the dividing member 462 directly diverts a portion of the total flow of treating agent to the central region 476 of the substrate and directly diverts the remaining portion of the treating agent to the peripheral region 477 of the substrate.

Referring still to FIG. 6, the inlet 470 to the gas distribution system 450 can be characterized by a first dimension such as radius $r_1$. Additionally, the portion of the total flow entering the outer plenum 466 through central inlet 472 can be dictated by a second dimension such as dividing member radius $r_2$. The remainder of the total flow enters the inner plenum 464 through the annular inlet 474 outside dividing member 462 between radii $r_1$ and $r_2$.

In addition to the position $r_2/r_1$ of the dividing member 462 at the inlet 470, the position $r_4/r_3$ of the dividing member at the gas distribution plate 480, as well as the distribution of openings in the inner plate member 481 and the outer plate member 482 are also utilized to adjust and/or control the uniformity of the spatial distribution of radicals at the surface of the substrate. These parameters may be determined using either experiment or simulation. Regarding $r_2/r_1$, for example, $0.1 \times r_1 < r_2 < 0.9 \times r_1$ (that is about $0.1 < \eta < 0.9$), alternatively, $0.3 \times r_1 < r_2 < 0.7 \times r_1$ (that is about $0.3 < \eta < 0.7$), and still alternatively, $0.4 \times r_1 < r_2 < 0.5 \times r_1$ (that is about $0.4 < \eta < 0.5$). Regarding $r_4/r_3$, for example, $r_4/r_3 \sim 0.7$ (this ratio splits wafer into two portions having same area), or alternatively $r_4/r_3 \sim 0.87$ (which splits the wafer area into about 75% central portion and 25% outer portion) Again, one of ordinary skill in the art may determine other values based on the teachings provided herein.

Figure 7:
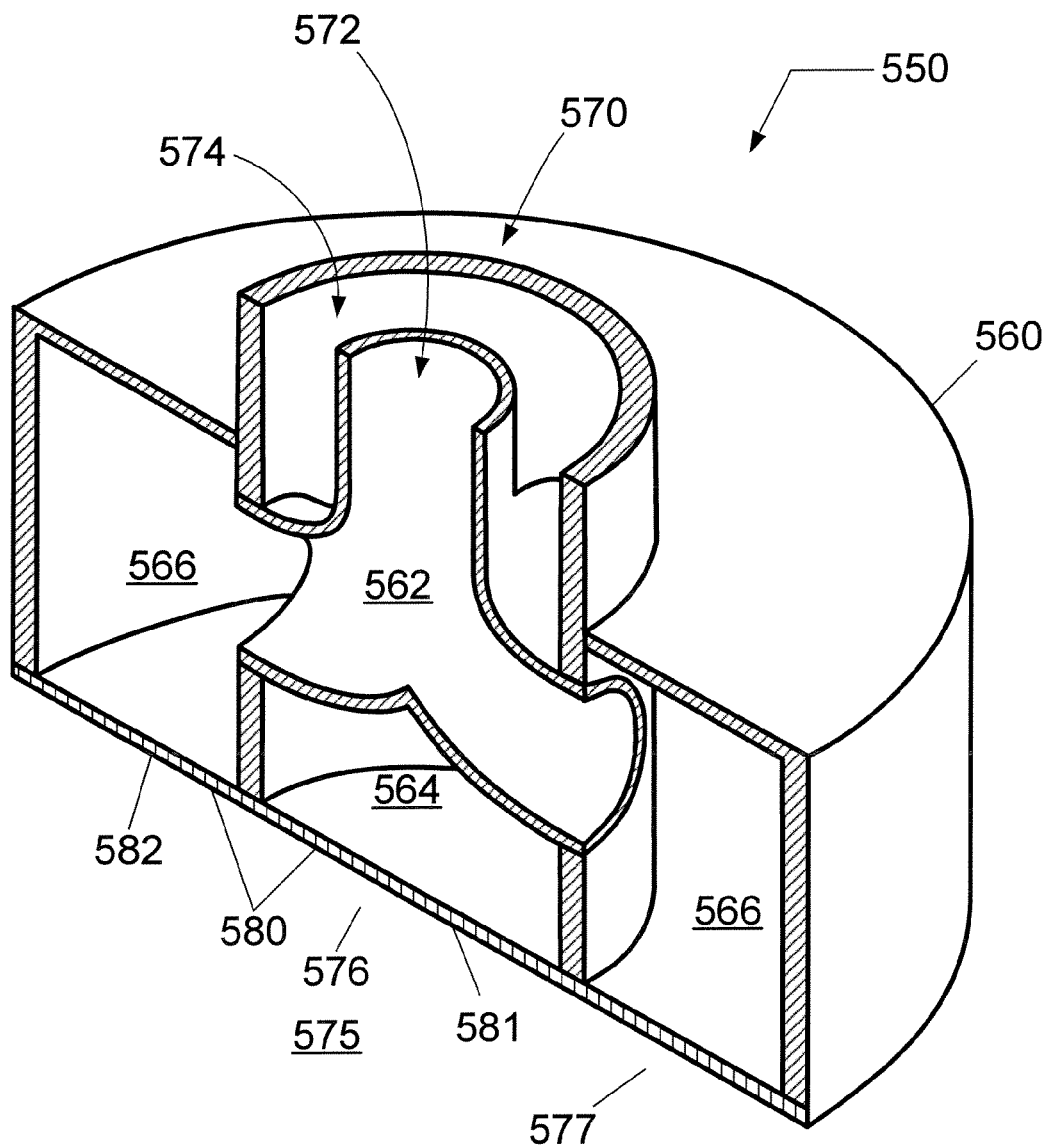
FIG. 7 shows a schematic diagram of a gas distribution system according to another embodiment.

According to another embodiment, FIG. 7 illustrates a schematic view of a gas distribution system 550. The gas distribution system 550 comprises a main body 560 having an inlet 570 coupled to a radical generation system, and configured to receive a flow of a treating agent from the radical generation system and distribute the flow of the treating agent through a gas distribution plate 580 above a substrate in process space 575.

The main body 560 comprises an inner plenum 564 and an outer plenum 566, separated from the inner plenum by dividing member 562. In this embodiment, the dividing member 562 diverts an inner portion of the flow of treating agent to a peripheral region above the substrate, while the dividing member diverts an outer portion of the flow of treating agent to a central region above the substrate. In doing so, relatively higher velocity fluid can be distributed to the peripheral region above the substrate, while relatively slower velocity fluid can be distributed to the central region above the substrate. As shown in FIG. 7, the diverting member 562 comprises four (4) outlets configured to distribute the treating agent in the outer plenum 566. However, there may be more or less outlets used to distribute the treating agent. In the embodiment of FIG. 7, the outlets are implemented as discrete ducts that extend radially outward from the central inlet 572 to the outer plenum 566. These outlets are preferably symmetrically spaced (for example, 4 outlets spaced 90° apart) to achieve uniform gas flow to all regions of the outer plenum 566. The annular inlet 574 is fluidly coupled to the inner plenum by flow paths created between individual ducts or outlets of the dividing member 562.

The inner plenum 564 is configured to receive an outer portion of the flow of treating agent entering inlet 570 through an annular inlet 574. Furthermore, the inner plenum 564 is configured to introduce this portion of the total flow to a substantially central region 576 of process space 575 through an inner plate member 581 of gas distribution plate 580. The outer plenum 566 is configured to receive an inner portion of the flow of treating agent entering inlet 570 through a central inlet 572. Furthermore, the outer plenum 566 is configured to introduce this portion of the total flow to a substantially peripheral region 577 of process space 575 through an outer plate member 582 of gas distribution plate 580.

The inner plate member 581 and the outer plate member 582 of gas distribution plate 580 are each designed with a plurality of openings (not shown in FIG. 7) ranging in number from approximately 1 opening to approximately 1000 openings, and desirably ranging in number from approximately 10 openings to approximately 100 openings. Additionally, for example, the inner plate member 581 and the outer plate member 582 can be designed with a plurality of openings, each opening having a diameter ranging from approximately 1 mm to approximately 100 mm, and desirably ranging from approximately 4 mm to approximately 10 mm. Furthermore, for example, the inner plate member 581 and the outer plate member 582 can be designed with a plurality of openings, each opening having a length ranging from approximately 1 mm to approximately 100 mm, and desirably ranging from approximately 2 mm to approximately 20 mm.

In one embodiment, the one or more openings are distributed uniformly on the inner plate member 581 and the outer plate member 582 of gas distribution system 580. Alternatively, in another embodiment, the one or more openings are not distributed uniformly on inner plate member 581 and outer plate member 582 of gas distribution system 580. Alternatively, in yet another embodiment, the distribution of the one or more openings is not uniform within the inner plate member 581, or the distribution of the one or more openings is not uniform within the outer plate member 582, or a combination thereof. For example, there may be more openings within a peripheral region of the inner plate member 581 than within a central region of the inner plate member 581.

The gas distribution plate 580 may be fabricated from a metal, such as aluminum or anodized aluminum, or a ceramic. For example, the gas distribution plate 580 may be fabricated from quartz, silicon, silicon nitride, silicon carbide, carbon, alumina, aluminum nitride, etc. Additionally, the gas distribution plate 580 can be coated with a ceramic material, such as aluminum oxide or yttrium oxide. For example, the gas distribution plate 580 may be coated with a material selected from the group consisting of $Al_2O_3$, $Sc_2O_3$, $Sc_2F_3$, $YF_3$, $La_2O_3$, $Y_2O_3$, and $DyO_3$.

Alternatively, the gas distribution plate 580 is not utilized, and the dividing member 562 directly diverts a portion of the total flow of treating agent to the central region 576 of the substrate and directly diverts the remaining portion of the treating agent to the peripheral region 577 of the substrate.

In the embodiments discussed above, gas flow is provided through the gas distribution plate through a plurality of openings. According to other embodiments of the invention, the gas distribution plate may include at least one gap or slot for providing gas therethrough. One advantage of this configuration is that the gas flow gap can also function to thermally and/or electrically insulate portions of the distribution plate so that such portions can be individually controlled. For example, different temperatures can be set for each separate portion of the gas distribution plate. Similarly, different DC and/or RF voltages can be applied to each separate portion of the gas distribution plate. Still further, the separate gas distribution plate parts can be made from different material. For example, a gap can create a boundary between ceramic and metallic plate portions of the gas distribution plate, with gas flowing between these portions.

Figure 8A:
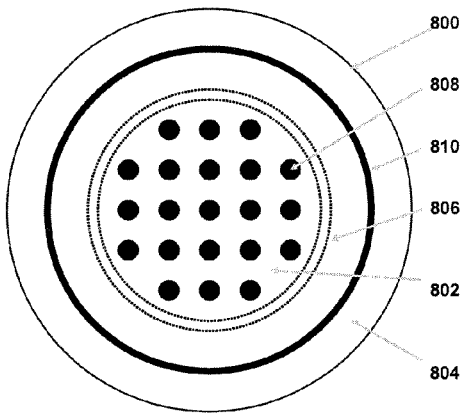
FIGS. 8A, 8B, 8C, 8D, 8E, and 8F each show a planar bottom view of a gas distribution system utilizing gas distribution gaps according to different embodiments of the invention.

FIGS. 8A, 8B, 8C, 8D, 8E, and 8F each show a planar bottom view of a gas distribution system utilizing gas distribution gaps according to different embodiments of the invention. Each of these figures shows a gas distribution plate including an inner plate member 802, an outer plate member 804 and a dividing member 806 (shown in phantom) for dividing the inner plate member 802 from the outer plate member 804, as discussed with respect to FIGS. 4-7 above. As seen in FIG. 8A, the inner plate member 802 includes openings 808 for providing process gas therethrough. However, process gas is provided in the outer plate region through a gap 810. In the embodiment of FIG. 8A, the gap 810 is a substantially continuous gap that separates outer plate member 808 into two concentric parts. While not shown, the substantially continuous gap 810 may include small bridging material portions that connect between the concentric parts to provide structural support.

Figure 8B:
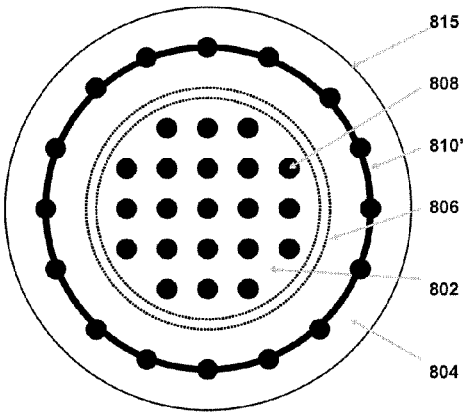
Figure 8C:
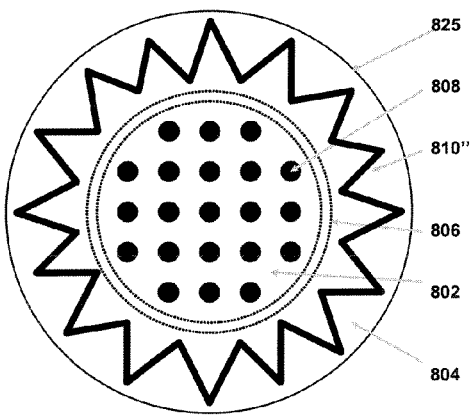

In the embodiment of FIG. 8A, the gap has a constant width; however, a variable width gap may be used. Further, as seen in FIG. 8B, the gap 810' can be combined with openings 806. While the contour of the gap 810 in FIG. 8A is circular, the gap may be serpentine as shown by gap 810" in FIG. 8C. As would be understood by one of ordinary skill in the art, the substantially continuous gap may have any contour, including complex contours, needed to achieve the desired gas distribution, thermal separation, and/or electrical separation properties for the gas distribution plate.

Figure 8D:
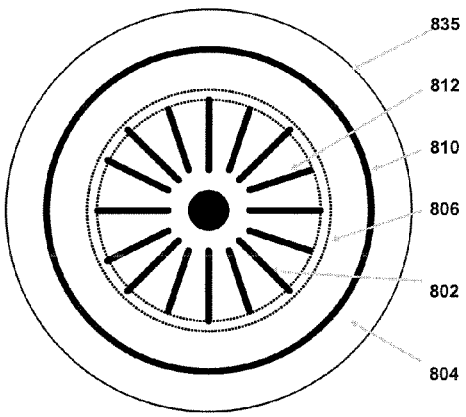

In still another embodiment, a plurality of discrete gaps may be provided in the gas distribution plate. As seen in FIG. 8D, gas distribution gaps 812 are provided in the inner plate member 802 to provide gas therethrough. As with the substantially continuous gas gap discussed above, each discrete gap 812 may have a continuous with or a variable width. For example, the with of the gaps in FIG. 8D may increase as the gap extends radially outward. Further, while the discrete gaps 812 are shown extending radially, the discrete gaps may extend in a spiral shape, circumferentially, or in any desired direction necessary to achieve the desired gas distribution, thermal separation, and/or electrical separation properties for the gas distribution plate.

Figure 8E:
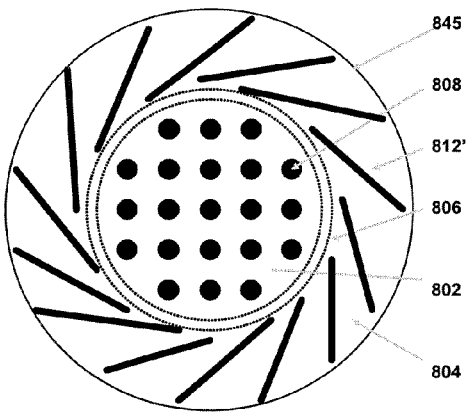
Figure 8F:
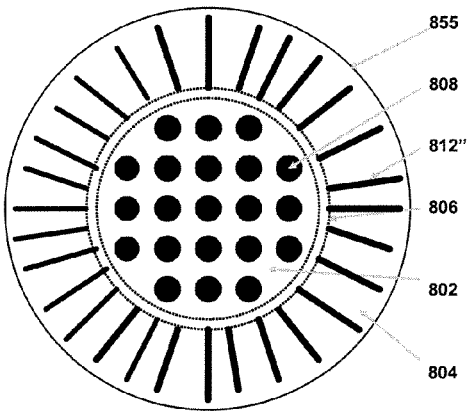

The embodiment of FIG. 8D also includes continuous gap 810 provided in an outer plate member 804 as discussed in FIG. 8A above. However, the discrete gaps 812 may also be provided in the outer plate member. For example, FIG. 8E shows discrete gaps 812' provided in a spiral shape in the outer plate member 804, and FIG. 8F shows discrete gaps 812" extending radially in the outer plate member 804. As would be understood by one of ordinary skill in the art, any combination of through holes, continuous gaps and discrete gaps may be used in the inner plate member and/or outer plate member, and may be used in any of the gas distribution system described herein.

Figure 9:
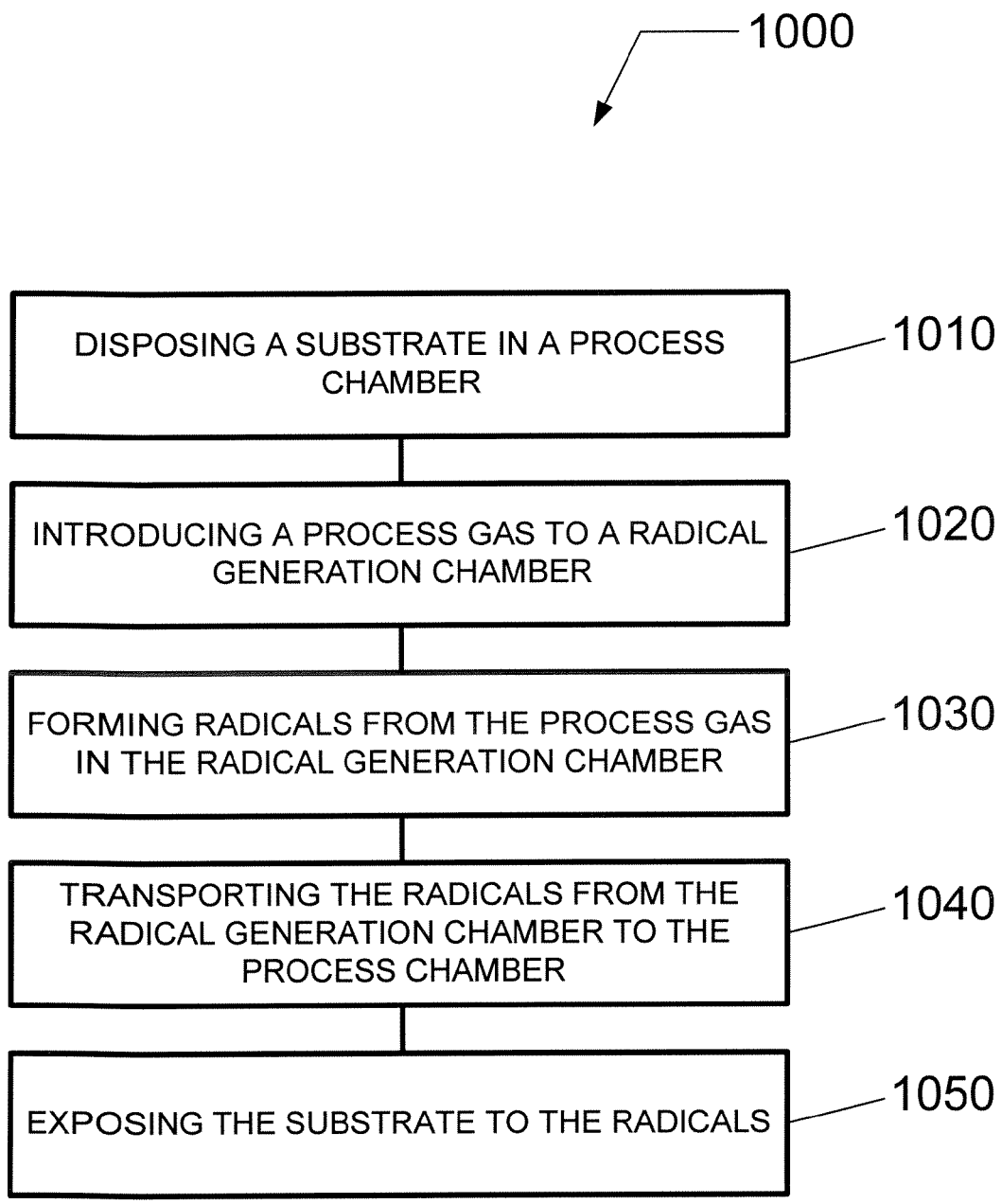
FIG. 9 presents a method of treating a substrate according to yet another embodiment.

Referring now to FIG. 9, a method for removing contaminants from a substrate are described according to an embodiment. The method comprises a flow chart 1000 beginning in 1010 with disposing the substrate on a pedestal in a process chamber. The process chamber can include the process chamber described in FIGS. 2 and 3.

In 1020, a process gas is introduced to a radical generation chamber coupled to the process chamber. The process gas can comprise any of the gases described above. For example, the process gas may comprise an oxygen containing gas, a hydrogen containing gas, or a fluorine containing gas, or any combination of two or more thereof. For instance, the process gas can include oxygen ($O_2$), hydrogen ($H_2$), CO, $CO_2$, NO, $NO_2$, $N_2O$ (or, more generally, $N_xO_y$), $N_2$, nitrogen trifluoride ($NF_3$), $NH_3$, $O_3$, $XeF_2$, $ClF_3$, a hydrocarbon (or, more generally, $C_xH_y$), a hydrofluorocarbon (or, more generally, $C_xH_yF_z$), or a fluorocarbon (or, more generally, $C_xF_y$), or any combination of two or more thereof, respectively.

For example, a process parameter space can comprise a chamber pressure of about 1 to about 10 Torr, a process gas flow rate ranging from about 3 to about 5 slm, and a pedestal temperature ranging from about 100 degrees C. to about 300 degrees C.

In 1030, radicals of the process gas are formed by the radical generation system. The radicals may be formed by forming plasma and inducing dissociation of the process gas. Alternatively, other techniques for dissociating the process gas may be employed, including electro-magnetic (EM) radiation such as ultraviolet (UV) radiation.

In 1040, the radicals formed from the process gas are transported from the radical generation chamber to the process chamber. For example, the radical may be transported through any one of the radical delivery systems depicted in FIGS. 4A, 4B, 6 and 7, or any combination thereof.

In 1050, the substrate is exposed to the flow of radicals, and the substrate is treated. The substrate may be exposed to radicals while not being exposed to plasma in the radical generation chamber.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A treatment system comprising:
   a process chamber, including a process space;
   a radical generation system coupled to said process chamber and configured to receive process gas and produce radicals from said process gas;
   a gas distribution system configured to receive and distribute a flow of said radicals within said process space, said gas distribution system comprising:
   a common inlet coupled to an exit of said radical generation system and configured to receive the flow of said radicals,
   an outlet coupled to said process chamber and having an area which corresponds to a single substrate to be processed in said process chamber, and
   a dividing member coupled to the gas distribution system and having a first end positioned at said common inlet to define an annular inlet of radius $r_1$ and a central inlet of radius $r_2$, and having a second end connected at said outlet to define an annular outlet of radius $r_3$ and a central outlet of radius $r_4$ such that the dividing member separately diverts a portion of the flow of said radicals from said common inlet through one of said central inlet and said annular inlet to a first plenum and out one of said central outlet and said annular outlet to a first region of said area of the outlet, and separately diverts the remaining portion of the flow of said radicals from said common inlet through the other of said central inlet and said annular inlet and to a second plenum, which is isolated from the first plenum, and out the other of said central outlet and said annular outlet to a second region of said area of the outlet, wherein a position of the dividing member is set to a predetermined value $r_2/r_1$ and $r_4/r_3$ to provide a predetermined distribution of said radicals in each of the first region and the second region in said area of the outlet;
   a pedestal coupled to said process chamber and configured to support a substrate in said process space of said process chamber and adjust the temperature of said substrate said pedestal having an area which corresponds to said area of the outlet; and
   a vacuum pumping system coupled to said process chamber and configured to evacuate said process chamber.

2. The treatment system of claim 1, wherein said first region comprises a substantially central region above said substrate and said second region comprises a substantially peripheral region above said substrate.

3. The treatment system of claim 2, wherein said dividing member diverts a substantially inner portion of the flow of said radicals to said first region above said substrate, and wherein said dividing member diverts a substantially outer portion of the flow of said radicals to said second region above said substrate.

4. The treatment system of claim 2, wherein said dividing member diverts a substantially inner portion of the flow of said radicals to said second region above said substrate, and wherein said dividing member diverts a substantially outer portion of the flow of said radicals to said first region above said substrate.

5. The treatment system of claim 1, wherein said gas distribution system comprises a main body, and said dividing member partitions said main body into said first plenum as an inner plenum and said second plenum as an outer plenum.

6. The treatment system of claim 5, wherein said gas distribution system further comprises a gas distribution plate coupled to said main body at an outlet of said inner plenum and an outlet of said outer plenum, and wherein said gas distribution plate comprises one or more openings there through.

7. The treatment system of claim 6, wherein said gas distribution plate comprises a plurality of openings distributed substantially equally on said gas distribution plate.

8. The treatment system of claim 6, wherein said gas distribution plate comprises a plurality of openings distributed unequally on said gas distribution plate.

9. The system according to claim 8, wherein distribution of said radicals in the first region and the second region is further controlled based on a number and distribution of the plurality of openings in said gas distribution plate in each of the first region and the second region.

10. The treatment system of claim 6, wherein said gas distribution plate comprises an inner plate member coupled to said gas distribution system at an outlet of said inner plenum, and said gas distribution plate comprises an outer plate member coupled to said gas distribution system at an outlet of said outer plenum.

11. The treatment system of claim 6, wherein said main body, said dividing member, or said gas distribution plate, or a combination of two or more thereof are fabricated from silicon dioxide or carbon.

12. The treatment system of claim 1, wherein said pedestal comprises one or more heating elements, or one or more cooling elements, or a combination thereof, configured to control said temperature of said substrate.

13. The treatment system of claim 1, wherein said dividing member is positioned in said common inlet to provide substantially equal gas flow to said first and second regions.

14. The treatment system of claim 1, wherein said process chamber, said radical generation system, said gas distribution system, or said pedestal, or a combination of two or more thereof have a coating formed on a surface thereof.

15. The treatment system of claim 14, wherein said coating contains at least one column III element.

16. The treatment system of claim 14, wherein said coating contains at least one element selected from the group consisting of $Al_2O_3$, $Sc_2O_3$, $Sc_2F_3$, $YF_3$, $La_2O_3$, $Y_2O_3$, and $DyO_3$.

17. The treatment system of claim 1, wherein said dividing member is positioned in said common inlet to provide substantially equal gas flow to said first and second regions.

18. The treatment system of claim 1, further comprising:
a process gas supply system coupled to said radical generation system, and configured to supply said process gas to said radical generation system.

19. The treatment system of claim 18, wherein said process gas supply system is configured to supply one or more of $H_2$, $O_2$, $N_2$, $F_2$, NO, $NO_2$, $N_2O$, CO, $CO_2$, $NH_3$, $NF_3$, a fluorocarbon, a hydrocarbon, or a hydrofluorocarbon, or any combination of two or more thereof.

20. A gas distribution system configured to be coupled to a substrate processing system for processing a single substrate, comprising:
a main body having a common inlet configured to receive a flow of process gas;
an outlet configured to distribute said process gas in said processing system the outlet having an area which corresponds to a single substrate to be processed in said process chamber; and
a dividing member coupled to said gas distribution system and having a first end positioned at said common inlet to define an annular inlet of radius $r_1$ and a central inlet of radius $r_2$, and having a second end connected at said outlet to define an annular outlet of radius $r_3$ and a central outlet of radius $r_4$ such that the dividing member separately diverts a portion of the flow of said process gas from said common inlet through one of said central inlet and said annular inlet to a first plenum and out one of said central outlet and said annular outlet to a first region of said area of the outlet, and separately diverts the remaining portion of the flow of said process gas from said common inlet through the other of said central inlet and said annular inlet and to a second plenum, which is isolated from the first plenum, and out the other of said central outlet and said annular outlet to a second region of said area of the outlet, wherein a position of the dividing member is set to a predetermined value $r_2/r_1$ and $r_4/r_3$ to provide uniformity of the distribution of said process gas over the single substrate.

21. The gas distribution system of claim 20, wherein said first region comprises a substantially central region above said substrate and said second region comprises a substantially peripheral region above said substrate.

22. The gas distribution system of claim 21, wherein said dividing member diverts a substantially inner portion of the flow of said process gas to said first region above said substrate, and wherein said dividing member diverts a substantially outer portion of the flow of said process gas to said second region above said substrate.

23. The gas distribution system of claim 21, wherein said dividing member diverts a substantially inner portion of the flow of said process gas to said second region above said substrate, and wherein said dividing member diverts a substantially outer portion of the flow of said process gas to said first region above said substrate.

24. The gas distribution system of claim 20, wherein said gas distribution system comprises a main body, and said dividing member partitions said main body into an inner plenum and an outer plenum.

25. The gas distribution system of claim 24, wherein said gas distribution system further comprises a gas distribution plate coupled to said main body at an outlet of said inner plenum and said outer plenum, and wherein said gas distribution plate comprises one or more openings there through.

* * * * *